(12) United States Patent
Kim et al.

(10) Patent No.: US 8,589,096 B2
(45) Date of Patent: Nov. 19, 2013

(54) METHOD FOR ESTIMATING REMAINING CAPACITY OF BATTERY

(75) Inventors: Woo Sung Kim, Gyeonggi-do (KR); Do Sung Hwang, Seoul (KR); Il Cho, Incheon (KR)

(73) Assignees: Hyundai Motor Company, Seoul (KR); Kia Motors Corporation, Seoul (KR)

(*) Notice: Subject to any disclaimer, the term of this patent is extended or adjusted under 35 U.S.C. 154(b) by 425 days.

(21) Appl. No.: 12/231,223

(22) Filed: Aug. 29, 2008

(65) Prior Publication Data
US 2009/0254290 A1    Oct. 8, 2009

(30) Foreign Application Priority Data

Apr. 3, 2008   (KR) .................. 10-2008-0031394

(51) Int. Cl.
*G01R 31/36*   (2006.01)
*H02J 7/16*    (2006.01)

(52) U.S. Cl.
USPC ............................................ 702/63; 320/132

(58) Field of Classification Search
USPC ................ 702/63; 320/132; 340/445, 639.19
See application file for complete search history.

(56) References Cited

U.S. PATENT DOCUMENTS

| | | | |
|---|---|---|---|
| 5,614,804 A * | 3/1997 | Kayano et al. | 320/134 |
| 5,619,118 A * | 4/1997 | Reipur et al. | 320/145 |
| 6,563,318 B2 * | 5/2003 | Kawakami et al. | 324/426 |
| 2003/0016023 A1 * | 1/2003 | Richter et al. | 324/427 |
| 2004/0128089 A1 * | 7/2004 | Barsoukov et al. | 702/65 |
| 2005/0154544 A1 * | 7/2005 | Ono | 702/63 |
| 2007/0139015 A1 * | 6/2007 | Seo et al. | 320/132 |
| 2007/0194791 A1 * | 8/2007 | Huang | 324/430 |

FOREIGN PATENT DOCUMENTS

| | | | |
|---|---|---|---|
| JP | 11223665 A | * | 8/1999 |
| JP | 2004-085269 | | 3/2004 |
| JP | 2006-017544 | | 1/2006 |
| JP | 2006-017682 | | 1/2006 |
| JP | 2006-275797 | | 10/2006 |
| KR | 10-2005-0019856 | | 3/2005 |

* cited by examiner

*Primary Examiner* — Marc Armand
*Assistant Examiner* — Michael Dalbo
(74) *Attorney, Agent, or Firm* — Edwards Wildman Palmer LLP; Peter F. Corless

(57) ABSTRACT

The present invention provides a technique for estimating a remaining capacity of a battery. In particular, the technique measures a current value, a voltage value and temperature of the battery and corrects the current value based on the voltage value. The corrected current value is then integrated and the result is used to calculate a current integration capacity by reflecting a charge/discharge efficiency accordingly. A battery forward voltage capacity is then determined from the measured current value, voltage value and temperature, and used to determine whether it is necessary to correct the current integration capacity. The current integration capacity is then converted into a remaining capacity, if it is determined that a correction is not necessary. If it is determined that a correction is necessary, the current integration capacity is corrected and then the corrected current integration capacity is converted into a remaining capacity.

12 Claims, 3 Drawing Sheets

METHOD FOR ESTIMATING REMAINING CAPACITY OF BATTERY

CROSS-REFERENCE TO RELATED APPLICATION

This application claims under 35 U.S.C. §119(a) the benefit of Korean Patent Application No. 10-2008-0031394 filed Apr. 3, 2008, the entire contents of which are incorporated herein by reference.

BACKGROUND (a) Technical Field

The present invention relates to a method for estimating a remaining capacity of a battery. More particularly, the present invention relates to a method for estimating a remaining capacity of a high-voltage battery (main battery), which is an energy source for driving a driving motor in an electric vehicle such as a hybrid vehicle and a fuel cell vehicle.

(b) Background Art

In general, a hybrid vehicle is driven by at least two different types of power source. For example, it is driven by an engine which generates a rotational force by burning fuel (fossil fuel such as gasoline) and an electric motor which generates a rotational force with electric power of a battery.

Typically, a hybrid vehicle is driven in an electric vehicle (EV) mode, which is directed to a pure electric vehicle mode using only the power of the electric motor (driving motor), in a hybrid electric vehicle (HEV) mode, which is an auxiliary mode using the rotational force of the driving motor as an auxiliary power source with the use of the rotational force of the engine as a main power source, or in a regenerative braking (RB) mode, in which the braking energy or inertia energy of the vehicle produced by braking or during driving by inertia is recovered by power generation of the driving motor and charged in a battery. Since the hybrid vehicle uses engine's mechanical energy and the battery's electrical energy simultaneously in an optimal operation range of the engine and the driving motor and the braking energy is recovered by the driving motor, it provides improved fuel efficiency and efficient energy utilization.

In the hybrid vehicle and the fuel cell vehicle which use a battery as an energy buffer as well as in the pure electric vehicle which uses only a battery as an energy source, the battery is one of the most important parts that determine the quality of the vehicle. Especially, since the battery (supplying electric power for driving the driving motor) serves as an auxiliary energy source that assists the output of the engine during driving and stores generated energy, the control technique thereof is very important.

Accordingly, the electric vehicle such as the hybrid vehicle or fuel cell vehicle that employs a high-voltage battery includes a battery management system (BMS) that generally controls the overall state of the battery. The BMS prevents the battery's life span from being shortened and provides information on the battery's state of charge (SOC) to a vehicle controller that performs the overall control of the vehicle, thus supporting the power generation control and driving control. In addition, the BMS performs various other functions such as estimation of the SOC (remaining capacity) of the battery, detection of full charge, balance maintenance of voltages between respective cell modules, control of maximum charge and discharge voltages according to the SOC of the battery, safety management and diagnosis, cooling control, and the like. Among them, the most important technique for the driving strategy of the vehicle is to calculate a remaining capacity of the battery.

When the remaining capacity of the battery is accurately estimated, it is possible to realize the hybrid system that can provide required power by charging surplus energy to the battery and discharging electricity when high power is required, thus maximizing the reduction in energy and the operation efficiency of the vehicle.

On the other hand, if the calculation of the remaining capacity is inaccurate, the operation efficiency of the vehicle is deteriorated, and a dangerous situation may be created. For example, although an actual capacity is 80%, if a calculated capacity is 30%, the vehicle controller determines that the battery needs to be charged, resulting in overcharging the battery. Contrarily, although an actual capacity is 30%, if a calculated capacity is 80%, the vehicle controller determines that the battery needs to be discharged, resulting in overdischarging the battery. Such an overcharging and over-discharging can cause a dangerous situation such as firing or explosion of the battery.

Conventional methods for calculating the remaining capacity are classified into two categories: the first category is to simply integrate a charge/discharge current amount and multiply the integrated value by a charge/discharge efficiency to calculate the remaining capacity; and the second category is to calculate the remaining capacity using a measured voltage value.

Although the first current integration method is widely used, it has drawbacks in that an error of a current sensor is continuously accumulated to deteriorate the accuracy of the calculation of the remaining capacity and it cannot estimate a self discharge capacity loss after a long-term halt. Moreover, it is difficult to calculate an accurate charge/discharge efficiency, and in the event that an initial SOC of the battery, which becomes a reference to calculate the remaining capacity, is incorrectly estimated, a significant cumulative error may occur. Furthermore, since the current amount during driving of the vehicle is continuously integrated using the initial SOC value, the error gradually diverges or converges to 0 due to the charge/discharge efficiency, temperature, use period (deterioration state of the battery), and the like. Actually, during repetition of charge and discharge, there is a change in the charge/discharge efficiency of the battery and, if the charge and discharge are frequently repeated during driving, a difference between the SOC value, updated by integration from the initial SOC upon start-up, and an actual value is gradually increased as the charge and discharge are repeated.

The second method of using the measured voltage value is to calculate the remaining capacity with a voltage value (electromotive force) with respect to the capacity and, if an accurate electromotive force value at a certain moment can be calculated, it can be used as an absolute SOC value. However, since the method for calculating the absolute electromotive force under dynamic circumstances of the hybrid battery system is very complicated, the calculation results have errors, and thus it is difficult to provide accurate calculation results of the remaining capacity.

Recently proposed methods combine the above two methods, in which the current integration is basically performed and the integrated current is corrected using the calculated electromotive force. In this case, the calculated electromotive force is utilized as an integration efficiency, and the correction is performed using a difference between the previous electromotive force and the currently calculated electromotive force.

In the case where the correction is performed in the above-described manner, since the current electromotive force and the previous electromotive force are all calculated electromotive forces, it is impossible to eliminate errors caused by the calculation. Accordingly, the errors by the calculation are continuously accumulated to deteriorate the accuracy of the remaining capacity. It is therefore necessary to provide a method for accurately calculating the remaining capacity by eliminating the errors that might occur during calculation of the remaining capacity.

The above information disclosed in this Background section is only for enhancement of understanding of the background of the invention and therefore it may contain information that does not form the prior art that is already known in this country to a person of ordinary skill in the art.

SUMMARY OF THE DISCLOSURE

The present invention has been made in an effort to solve the above-described problems associated with prior art.

In one aspect, the present invention provides a method for estimating a remaining capacity of a battery, the method comprising: measuring a current value, a voltage value and temperature of the battery; correcting the current value based on the voltage value; calculating a current integration value by integrating the corrected current value and calculating a current integration capacity from the calculated current integration value by reflecting a charge/discharge efficiency; determining a battery forward voltage capacity from the measured current value, voltage value and temperature, and determining whether it is necessary to correct the current integration capacity based on the forward voltage capacity; converting the current integration capacity into a remaining capacity, if it is determined that it is not necessary to correct; and correcting, if it is determined that it is necessary to correct, the current integration capacity and converting the corrected current integration capacity into a remaining capacity.

In a preferred embodiment, the correction of the current value based on the voltage value comprises obtaining a change in current due to a change in voltage from a battery characteristic table, which has been data processed, and correcting the current value using a correction amount determined from the change in current.

In another preferred embodiment, the determination of whether it is necessary to correct the current integration capacity comprises: calculating a battery forward voltage based on the measured current value, voltage value, and temperature; determining, based on the calculated forward voltage, a forward voltage capacity from a forward voltage-capacity map table; comparing a deviation between the calculated current integration capacity and the forward voltage capacity with a predetermined reference value; and determining that it is necessary to correct the current integration capacity, if the deviation exceeds the reference value.

In still another preferred embodiment, the current integration capacity is corrected using an error rate of the forward voltage calculation, a current integration value error rate corresponding to the deviation between the calculated current integration capacity and the forward voltage capacity, and a predetermined reference error rate. Preferably, the error rate of the forward voltage calculation may be obtained from a table defined as a value according to a battery temperature/forward voltage error rate obtained by an actual vehicle test.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like.

The above features and advantages of the present invention will be apparent from or are set forth in more detail in the accompanying drawings, which are incorporated in and form a part of this specification, and the following Detailed Description, which together serve to explain by way of example the principles of the present invention.

BRIEF DESCRIPTION OF THE DRAWINGS

The above and other features of the present invention will now be described in detail with reference to certain exemplary embodiments thereof illustrated the accompanying drawings which are given hereinafter by way of illustration only, and thus are not limitative of the present invention, and wherein.

Figure 1:
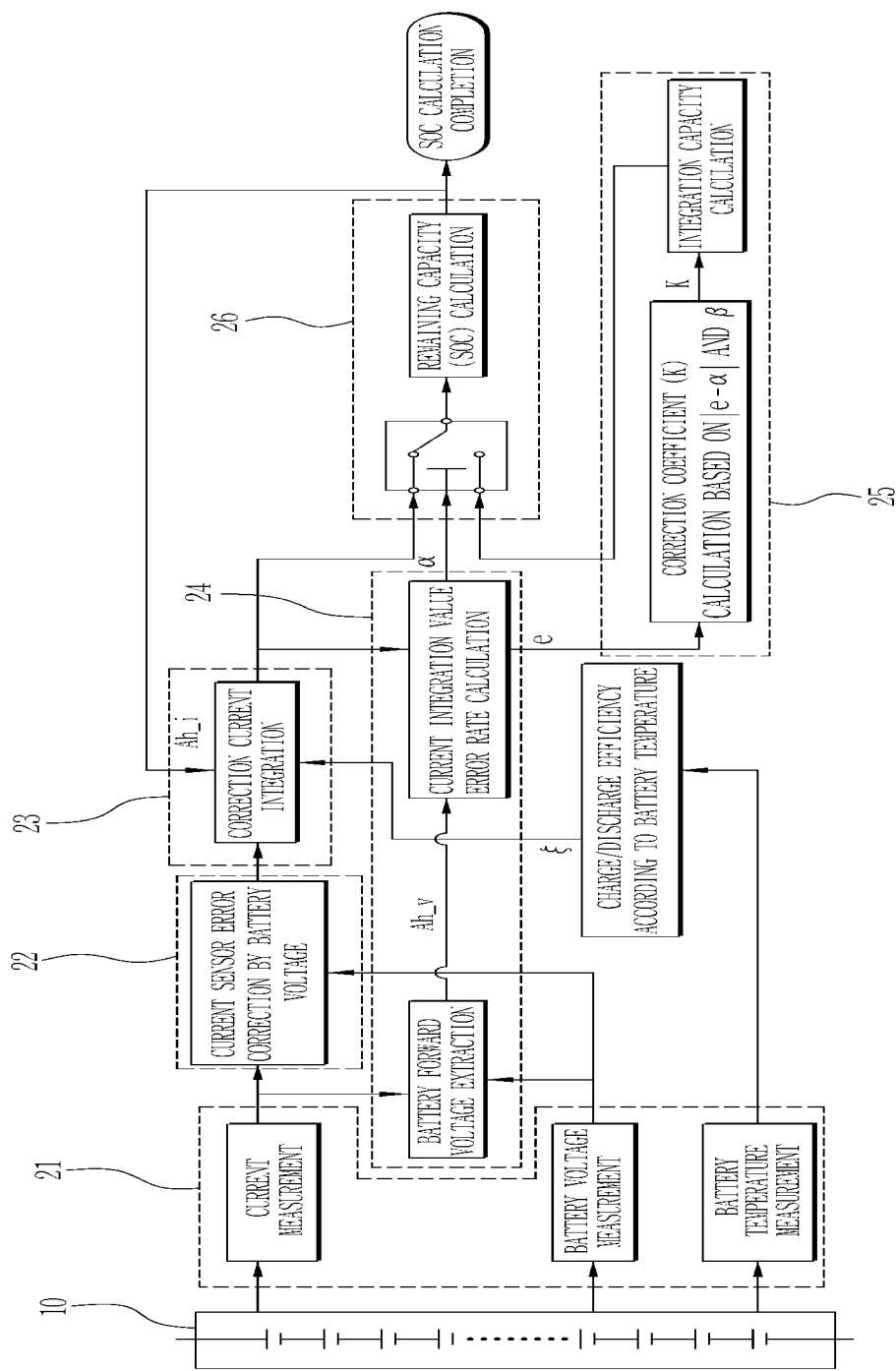
FIG. 1 is a block diagram showing a process of calculating a remaining capacity of a battery in accordance with the present invention.

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

DETAILED DESCRIPTION

Reference will now be made in detail to the preferred embodiments of the present invention, examples of which are illustrated in the drawings attached hereinafter, wherein like reference numerals refer to like elements throughout. The embodiments are described below so as to explain the present invention by referring to the figures.

Figure 2:
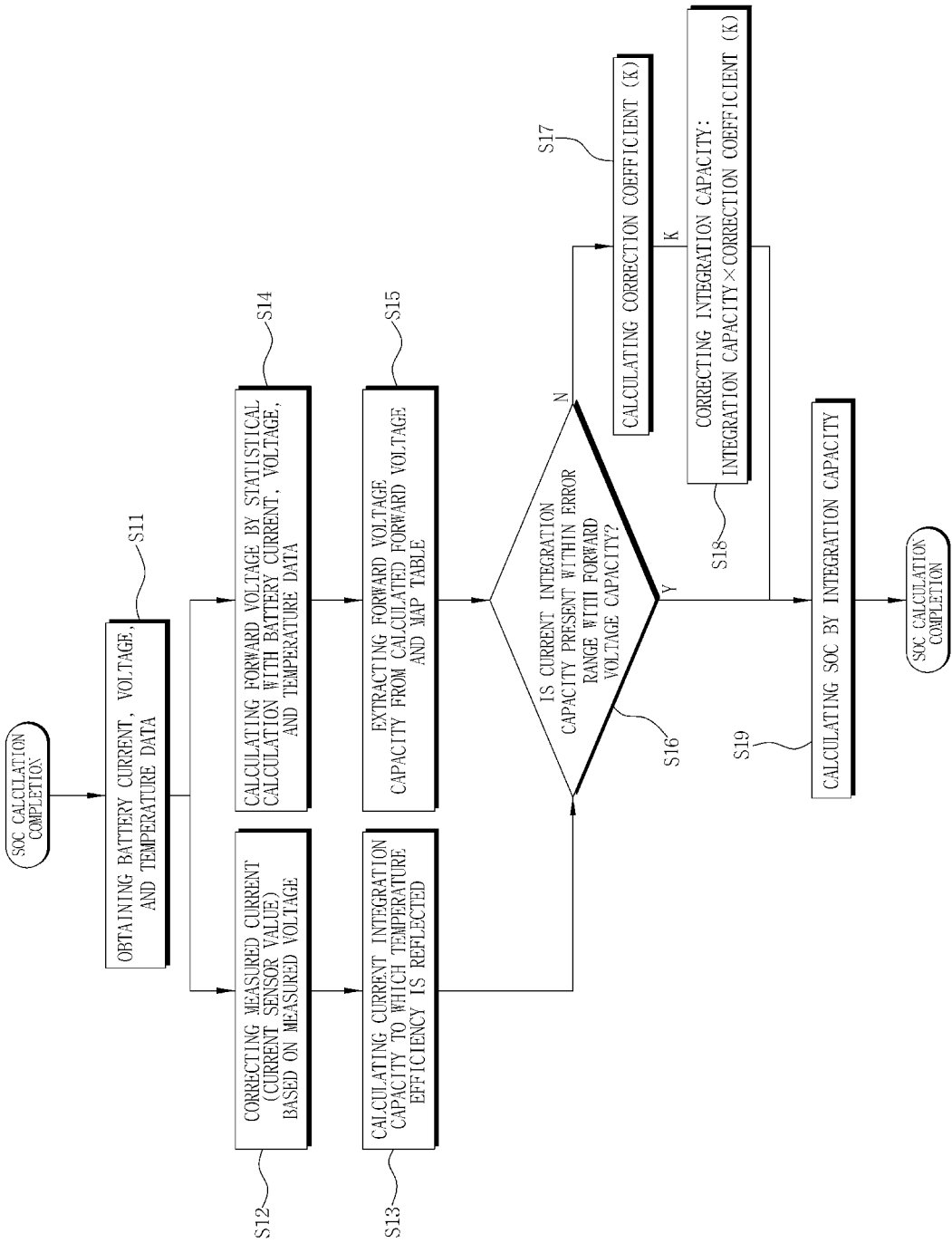
FIG. 2 a flowchart showing the process of calculating a remaining capacity of a battery in accordance with the present invention.
Figure 3:
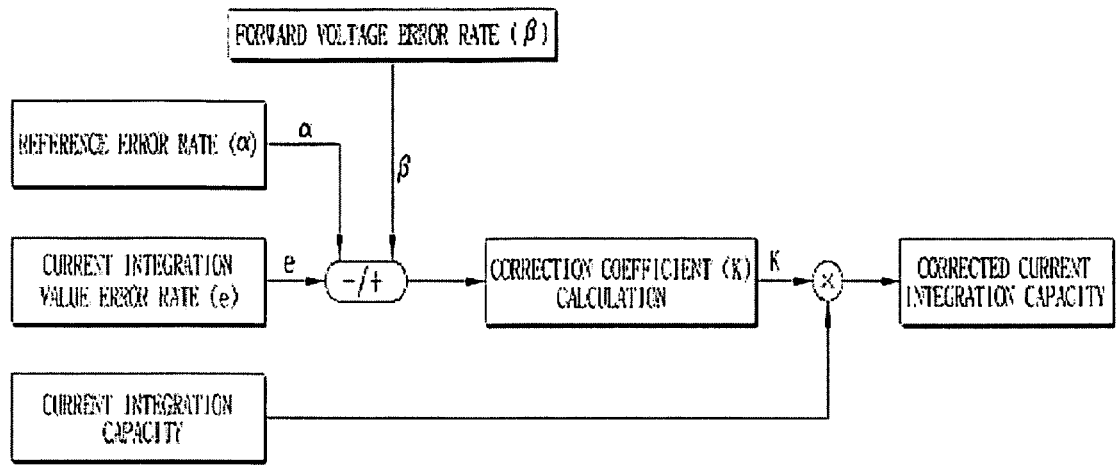
FIG. 3 is a block diagram showing a process of correcting a current integration capacity in the process of calculating a remaining capacity of a battery in accordance with the present invention.

FIG. 1 is a block diagram showing a process of calculating a remaining capacity of a battery in accordance with the present invention, FIG. 2 a flowchart showing the process of calculating a remaining capacity of a battery in accordance with the present invention, and FIG. 3 is a block diagram showing a process of correcting a current integration capacity in the process of calculating a remaining capacity of a battery in accordance with the present invention.

As shown in the figures, the method for calculating a remaining capacity of a battery includes a process of obtaining information about the status of a battery 10 (S11), in which a current value, a voltage value and temperature of the battery are measured by various sensors in real-time and input to a battery information obtaining unit 21 of a BMS that calculates a state of charge (SOC) of the battery.

When the battery information such as the battery current, voltage and temperature are measured and obtained from the battery 10, a current correction unit 22 receives the measured voltage value and current value from the battery information obtaining unit 21 to correct the current value based on the voltage value, thus eliminating an error of a current sensor (S12).

If the measured current value, i.e., the value of the current sensor, is directly integrated to calculate a current integration value, an error of the current sensor is directly reflected thereto. Accordingly, it is possible to reduce and/or eliminate the error of the current sensor by correcting the measured current value using the simultaneously measured voltage value. The voltage induced when applying a certain current to the battery is an intrinsic characteristic of the corresponding battery, and the problem of a change in voltage with respect to an input current can be measured for the respective capacities and solved. For example, by an experiment in which a certain current is applied to the corresponding battery to measure a voltage, a battery characteristic table, in which the change in voltage due to the change in current has been data processed, is used as a table for the current correction.

If a value of current flowing in the battery is A and a value measured by the current sensor, i.e., the measured current value, is A', there exists a measurement error by a difference between A and A'. Accordingly, it is necessary to correct the measured current value based on the measured voltage value in order to eliminate the error of the current sensor. At this time, in order to correct the measured current value for integration, a change in current due to a change in voltage is extracted from the battery characteristic table, which has been data processed by the experiment, to determine a correction amount from the extracted change in current, and the correction amount is applied to the measured current value to be corrected. Like this, the correction current value, from which the sensor error is eliminated, is used to calculate the capacity.

Moreover, a current integration unit 23 performs a process in which the current value corrected by the current correction unit 22 is integrated to calculate a current integration value, and a charge/discharge efficiency according to the battery temperature is reflected on the current integration value, thus calculating a current integration capacity (S13). In this case, the current integration value calculated by integrating the corrected current value is multiplied by the charge/discharge efficiency according to the battery temperature, thus calculating the current integration capacity. Accordingly, when the current value, from which the sensor error is eliminated, is integrated and the charge/discharge efficiency according to the battery temperature is reflected thereon, it is possible to accurately calculate the actual battery capacity under various temperature conditions.

Subsequently, a battery forward voltage capacity is determined from the obtained battery information (S14 and S15). Then, a process of determining whether to perform the correction of the current integration capacity based on the thus determined forward voltage capacity is performed (S16). If it is determined that the correction is necessary, a process of eliminating an error of the current integration capacity by the calculation is performed (S17 and S18).

In particular, a correction determination unit 24 calculates a battery forward voltage from the battery information (S14), determines a capacity according to the forward voltage (hereinafter referred to as a forward voltage capacity) from the calculated battery forward voltage (S15), and determines whether to perform the correction of the integration capacity by comparing the calculated current integration capacity with the forward voltage capacity (S16). Only when it is determined by the correction determination unit 24 that the correction is needed, an integration correction unit 25 calculates a correction coefficient (K) (S17) to correct the current integration capacity (S18).

Preferably, in the process of determining whether to perform the correction (S16), the battery forward voltage is calculated based on the battery information, such as the battery current, voltage, and temperature, obtained by the battery information obtaining unit 21, and then the forward voltage capacity is determined based on the calculated forward voltage. Subsequently, a deviation between the current integration capacity calculated by the current integration unit 23 and the forward voltage capacity is calculated, and then it is determined whether to perform the correction by comparing the deviation between the current integration capacity and the forward voltage capacity with a reference value. In this case, the forward voltage is obtained by statistical calculation with the battery current, voltage, and temperature data, and the thus obtained forward voltage is converted into a forward voltage capacity from a forward voltage-capacity map table and used to calculate a deviation between the current integration capacity and the thus converted forward voltage capacity.

Figure 4:
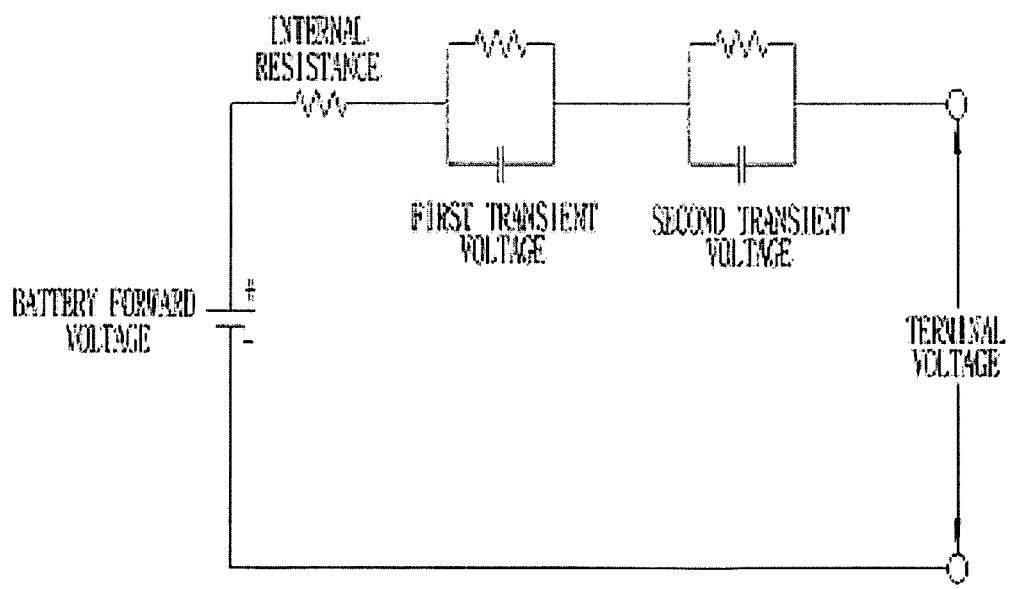
FIG. 4 is a diagram showing an equivalent circuit model for calculating a battery forward voltage.

As shown in FIG. 4, the battery forward voltage may be obtained by eliminating a voltage drop component by an internal resistance and first and second transient voltage components from a terminal voltage of the battery. The transient voltage occurs when a current is applied to the battery and is terminated when the current is removed. The transient voltage is classified into two components according to the termination time, in which the voltage component terminated for a short period of time is called the first transient voltage and the voltage component terminated for a long period of time is called the second transient voltage.

Accordingly, the transient voltage can be represented as a function with respect to time, and maximum and minimum values for a predetermined period of time (t) can be obtained by experiment. When the voltage drop component by the internal resistance is eliminated by obtaining an average value of the terminal voltage for a predetermined period of time (t) (the average value can be obtained by various mathematical methods, i.e., by a statistical formula such as a least squares method, for example) and the calculated transient voltage components are eliminated, it is possible to obtain the battery forward voltage.

However, the thus calculated forward voltage may have an error with respect to an actual forward voltage in the event that the battery is being used with an average value for a predetermined period of time (t). An error rate ($\beta$) of the forward voltage may be obtained as a value with respect to the temperature/capacity of the battery by an actual vehicle test in advance. The error rate of the forward voltage may be formed into a map table to obtain an error rate with respect to the previous forward voltage or capacity and temperature, and the thus obtained value may be used to eliminate the calculation error and correct the capacity. Preferably, during capacity correction to be described below, the error rate ($\beta$) of the forward voltage may be obtained from a table defined as a value according to the battery temperature/forward voltage error rate obtained by an actual vehicle test.

If it is determined by the correction determination unit 24 that the deviation between the current integration capacity and the forward voltage capacity exceeds a predetermined reference value, the integration correction unit 25 corrects the current integration capacity (i.e., a current integration value to which the charge/discharge efficiency according to the battery temperature is reflected).

In more detail, the correction determination unit 24 obtains a current integration value error rate (e) corresponding to a deviation between the calculated current integration capacity and the calculated forward voltage capacity and compares the same with a reference error rate ($\alpha$), which is a predetermined reference value. If the current integration value error rate (e) exceeds the reference error rate ($\alpha$), i.e., if a deviation beyond the reference value occurs, a correction coefficient (K) is calculated (S17), and a correction for the current integration capacity is performed using the same (S18). As shown in FIG. 3, the correction for the current integration capacity is performed in the following manner. A difference (|e−α|) between the current integration value error rate (e) and the reference error rate (α) is obtained and then a capacity correction coefficient (K) is obtained by adding the error rate (β) by the forward voltage calculation thereto. Subsequently, the thus obtained correction coefficient (K) is multiplied by the current integration capacity to complete the capacity correction. Then, if the corrected current integration capacity is transmitted to an SOC (remaining capacity) calculation unit 26, the SOC calculation unit 26 converts the corrected current integration capacity into an SOC (remaining capacity), thus completing the SOC calculation (S19).

If it is determined by the correction determination unit 24 that the deviation between the current integration capacity and the forward voltage capacity does not exceed the reference value, i.e., that the current integration capacity is present within an error range with respect to the forward voltage capacity, the current integration capacity calculated by the current integration unit 23, i.e., the current integration capacity, from which the current sensor error is eliminated by the voltage, is directly converted into a final SOC by the SOC calculation unit 26 without any correction, thus completing the SOC calculation (S19).

As above, during the calculation of the final SOC in accordance with the present invention, the SOC calculation unit selects any one of the current integration capacity, from which the current sensor error is eliminated by the voltage, and the correction capacity, from which the error rate is eliminated by the forward voltage calculation, (current integration capacity corrected by the integration correction unit) based on the determination result of the correction determination unit to calculate the final SOC value. That is, in the event that the correction is selectively performed based on the correction determination result, the calculation logic is simplified, and the deviation between the capacity by the current integration and the capacity according to the battery forward voltage can be maintained within a predetermined range, thus maintaining high accuracy, differently from the conventional method for calculating the remaining capacity that performs the capacity correction every predetermined time.

As described above, the present invention aims at providing a more precise calculation of the remaining capacity (SOC) of the battery by measuring the battery information such as current, voltage and temperature, correcting the measured current value based on the measured voltage value to eliminate the current measurement error, calculating the battery forward voltage based on the measured battery information, and eliminating the error caused by the calculation using the predetermined calculated forward voltage error rate and the current integration value error rate.

Moreover, the present invention has a characteristic feature in that the current integration capacity, from which the current sensor error is eliminated by the voltage, and the capacity according to the calculated battery forward voltage are compared to determine whether to perform the correction, and the correction of the current integration capacity is selectively performed based on the determination result, thus calculating the final SOC value having a high accuracy.

Furthermore, the present invention determines the calculation accuracy of the remaining capacity by the integration using the error rate and determines whether to perform the correction, thus increasing the calculation accuracy of the remaining capacity.

Especially, since the correction is selectively performed based on the correction determination result, the calculation logic is simplified, and the deviation between the capacity by the current integration and the capacity according to the battery forward voltage can be maintained within a predetermined range, thus maintaining high accuracy, differently from the conventional method for calculating the remaining capacity that performs the capacity correction every predetermined time.

The invention has been described in detail with reference to preferred embodiments thereof. However, it will be appreciated by those skilled in the art that changes may be made in these embodiments without departing from the principles and spirit of the invention, the scope of which is defined in the appended claims and their equivalents.

What is claimed is:

1. A method for estimating a remaining capacity of a battery, the method comprising:
measuring, by a processor, a current value, a voltage value and temperature of the battery in real time;
correcting, by the processor, the measured current value based on the measured voltage value by obtaining a change in current due to a change in voltage from a battery characteristic table that has been data processed, and correcting the measured current value using a correction amount determined from the change in current;
calculating, by the processor, a current integration value by integrating the corrected current value and calculating a current integration capacity from the calculated current integration value by reflecting a charge/discharge efficiency;
determining, by the processor, a battery forward voltage capacity from a battery forward voltage calculated from the measured current value, voltage value and temperature, and determining whether it is necessary to correct the current integration capacity based on the forward voltage capacity, wherein the battery forward voltage is a value obtained by eliminating from a terminal voltage of the battery a voltage drop component associated with an internal resistance, and a first and second transient voltage component, and the voltage drop component by the internal resistance is eliminated by obtaining an average value of the terminal voltage for a predetermined period of time;
converting, by the processor, the current integration capacity into a remaining capacity, if it is determined that it is not necessary to correct; and
in response to determining that it is necessary to correct the current integration capacity, correcting, by the processor, the current integration capacity by:
obtaining a current integration value error rate (e) corresponding to a deviation between the calculated current integration capacity and the calculated forward voltage capacity and comparing the current integration value error rate (e) with a reference error rate (α),
when (e) is greater than (α), calculating a capacity correction coefficient (K) by adding an error rate (β) of the battery forward voltage calculation to a difference between the current integration error rate and the reference error rate, and
converting the corrected current integration capacity into a remaining capacity by multiplying the calculated coefficient K by the current integration capacity,
wherein the calculated current integration capacity from which a current sensor error is eliminated by a voltage, and the battery forward voltage capacity from which an error rate is eliminated by the calculated battery forward voltage are compared to determine whether to perform the correction, and the correction of the current integration capacity is selectively performed based on the determination result to calculate the final remaining capacity of a battery,
wherein determining whether it is necessary to correct the current integration capacity includes:
calculating the battery forward voltage based on the measured current value, voltage value, and temperature, determining, based on the calculated forward voltage, a forward voltage capacity from a forward voltage-capacity map table,
comparing a deviation between the calculated current integration capacity and the battery forward voltage capacity with a predetermined reference value, and
determining that it is necessary to correct the current integration capacity, when the deviation exceeds the reference value.

2. The method of claim 1, wherein the current integration capacity is corrected using an error rate of the forward voltage calculation, a current integration value error rate corresponding to the deviation between the calculated current integration capacity and the forward voltage capacity, and a predetermined reference error rate.

3. The method of claim 2, wherein the error rate of the forward voltage calculation is obtained from a table defined as a value according to a battery temperature/forward voltage error rate obtained by an actual vehicle test.

4. A system for estimating the state of charge of a battery, comprising:
a battery in a vehicle;
a plurality of sensors configured to measure, in real time, information pertaining to the battery including a current value, a voltage value and a temperature of the battery; and
a battery information management system configured to:
receive the real time information measured by the plurality of sensors,
correct the measured current value based on the measured voltage value by obtaining a change in current due to a change in voltage from a battery characteristic table, that has been data processed, and correcting the measured current value using a correction amount determined from the change in current in real time,
calculate a current integration value by integrating the corrected current value and calculating a current integration capacity from the calculated current integration value by reflecting a charge/discharge efficiency,
determine a battery forward voltage capacity from a battery forward voltage calculated from the measured current value, voltage value and temperature, and determining whether it is necessary to correct the current integration capacity based on the forward voltage capacity, wherein the battery forward voltage is a value obtained by eliminating from a terminal voltage of the battery:
a voltage drop component associated with an internal resistance, wherein the voltage drop component by the internal resistance is eliminated by obtaining an average value of the terminal voltage for a predetermined period of time, and
a first and second transient voltage component,
convert the current integration capacity into a remaining capacity, if it is determined that it is not necessary to correct, and
in response to determining that it is necessary to correct the current integration capacity, correcting the current integration capacity by:
obtaining a current integration value error rate (e) corresponding to a deviation between the calculated current integration capacity and the calculated forward voltage capacity and comparing the current integration value error rate (e) with a reference error rate ($\alpha$),
when (e) is greater than ($\alpha$), calculating a capacity correction coefficient (K) by adding an error rate ($\beta$) of the battery forward voltage calculation to a difference between the current integration error rate and the reference error rate, and
converting the corrected current integration capacity into a remaining capacity by multiplying the calculated coefficient K by the current integration capacity,
wherein the calculated current integration capacity from which a current sensor error is eliminated by a voltage, and the battery forward voltage capacity from which an error rate is eliminated by the calculated battery forward voltage are compared to determine whether to perform the correction, and the correction of the current integration capacity is selectively performed based on the determination result to calculate the final remaining capacity of a battery,
wherein the determination of whether it is necessary to correct the current integration capacity includes:
a calculation of the battery forward voltage based on the measured current value, voltage value, and temperature,
a determination based on the calculated forward voltage, the battery forward voltage capacity from a forward voltage-capacity map table, a comparison of a deviation between the calculated current integration capacity and the battery forward voltage capacity with a predetermined reference value, and
a determination that it is necessary to correct the current integration capacity, when the deviation exceeds the reference value.

5. The system of claim 4 wherein the transient voltage occurs when a current is applied to the battery and is terminated when the current is removed and is classified into two components according to termination time.

6. The system of claim 5, wherein the first transient voltage component is terminated for a short period of time and the second transient voltage is terminated for a longer period of time than the first component.

7. The system of claim 4 wherein when the voltage drop component by internal resistance is eliminated by obtaining an average value of the terminal voltage for a period of time and the calculated transient voltage components are eliminated.

8. The method of claim 4, wherein the current integration capacity is corrected using an error rate of the forward voltage calculation, a current integration value error rate corresponding to the deviation between the calculated current integration capacity and the forward voltage capacity, and a predetermined reference error rate.

9. The method of claim 8, wherein the error rate of the forward voltage calculation is obtained from a table defined as a value according to a battery temperature/forward voltage error rate obtained by an actual vehicle test.

10. The system of claim 1 wherein the transient voltage occurs when a current is applied to the battery and is terminated when the current is removed and is classified into two components according to termination time.

11. The system of claim 10, wherein the first transient voltage component is terminated for a short period of time and the second transient voltage is terminated for a longer period of time than the first component.

12. The system of claim 1 wherein when the voltage drop component by internal resistance is eliminated by obtaining an average value of the terminal voltage for a period of time and the calculated transient voltage components are eliminated.

* * * * *